(12) United States Patent
Schiek et al.

(10) Patent No.: US 12,456,958 B2
(45) Date of Patent: Oct. 28, 2025

(54) BULK ACOUSTIC WAVE DEVICE WITH REDUCED NON-LINEARITIES

(71) Applicant: RF360 SINGAPORE PTE. LTD., Republic Plaza (SG)

(72) Inventors: Maximilian Schiek, Puchheim (DE); Willi Aigner, Moosinning (DE); Thomas Mittermaier, Schwindegg (DE)

(73) Assignee: RF360 Singapore Pte. Ltd., Singapore (SG)

( * ) Notice: Subject to any disclaimer, the term of this patent is extended or adjusted under 35 U.S.C. 154(b) by 852 days.

(21) Appl. No.: 17/606,626

(22) PCT Filed: Apr. 23, 2020

(86) PCT No.: PCT/EP2020/061372
§ 371 (c)(1),
(2) Date: Oct. 26, 2021

(87) PCT Pub. No.: WO2020/221655
PCT Pub. Date: Nov. 5, 2020

(65) Prior Publication Data
US 2022/0271727 A1    Aug. 25, 2022

(30) Foreign Application Priority Data

Apr. 30, 2019    (DE) ..................... 10 2019 111 172.2

(51) Int. Cl.
*H03H 9/02*    (2006.01)
*H03H 9/13*    (2006.01)
(Continued)

(52) U.S. Cl.
CPC .... *H03H 9/02015* (2013.01); *H03H 9/02157* (2013.01); *H03H 9/132* (2013.01); *H03H 9/171* (2013.01); *H03H 9/542* (2013.01)

(58) Field of Classification Search
CPC .......... H03H 9/02125; H03H 9/02157; H03H 9/02015; H03H 9/564; H03H 9/542; H03H 9/171; H03H 9/132
See application file for complete search history.

(56) References Cited

U.S. PATENT DOCUMENTS

| 9,362,884 | B2 | 6/2016 | Moreno et al. |
| 9,602,076 | B1 | 3/2017 | Kreuzer et al. |
| (Continued) | | | |

FOREIGN PATENT DOCUMENTS

| CA | 2259034 A1 * | 4/1997 |
| CN | 101931380 A | 12/2010 |
| (Continued) | | |

OTHER PUBLICATIONS

International Search Report and Written Opinion—PCT/EP2020/061372—ISA/EPO—Jul. 3, 2020.

*Primary Examiner* — J. San Martin
(74) *Attorney, Agent, or Firm* — Polsinelli

(57) ABSTRACT

A BAW device comprises a first BAW resonator (1) and a second BAW resonator (2). The first BAW resonator and the second BAW resonator each comprise a first electrode (11, 21), a second electrode (12, 22) and a piezoelectric layer (13, 23) being arranged in each case between the first electrode and the second electrode of the associated BAW resonator. The first electrodes, the second electrodes and the piezoelectric layers of both BAW resonators are designed essentially identically. A first conductor track (24) extends from the first electrode of the second BAW resonator to a third electric element (3) of the BAW device and electrically connects said first electrode with said third electric element. A first dummy conductor track (14) extends from the first electrode of the first BAW resonator, is electrically connected to said first electrode and, apart from said first electrode, is not electrically connected to any further electric (Continued)

Figure 1A:
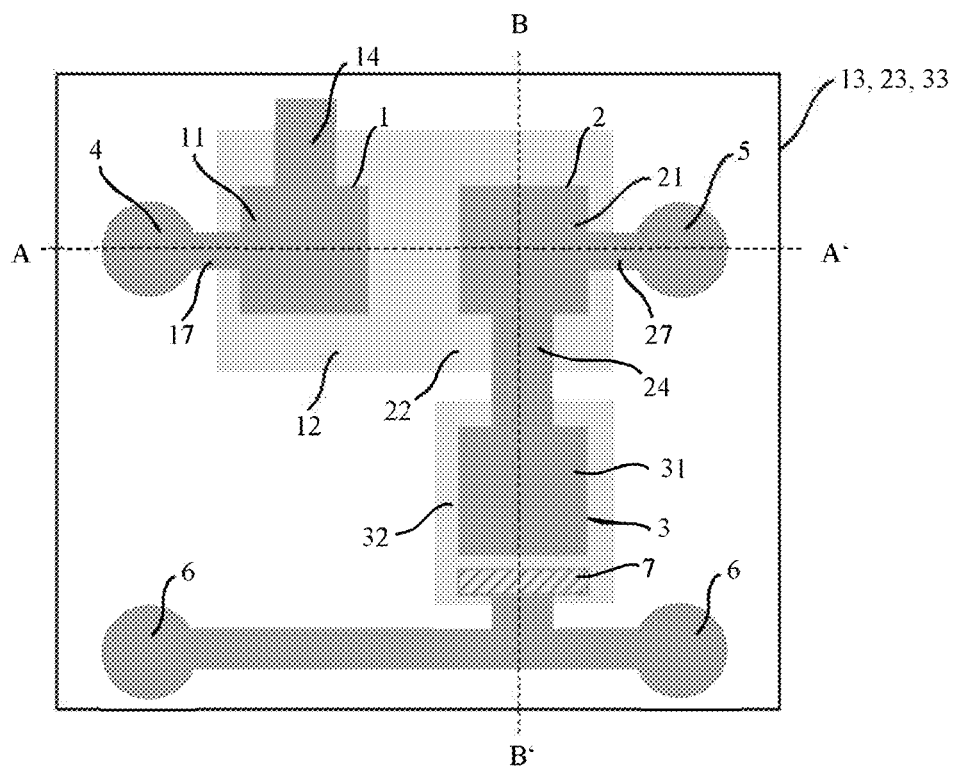

element. The first dummy conductor track is designed such that it influences the acoustic and capacitive properties of the first BAW resonator essentially in the same way as the first conductor track influences the acoustic and capacitive properties of the second BAW resonator.

14 Claims, 3 Drawing Sheets

(51) Int. Cl.
      *H03H 9/17*      (2006.01)
      *H03H 9/54*      (2006.01)

(56) References Cited

U.S. PATENT DOCUMENTS

| | | | |
|---|---|---|---|
| 2001/0038255 A1* | 11/2001 | Wadaka | H03H 9/173 310/313 R |
| 2017/0163242 A1 | 6/2017 | Miyamoto et al. | |
| 2018/0294792 A1 | 10/2018 | Lee et al. | |
| 2022/0376673 A1* | 11/2022 | Schiek | H03H 3/02 |

FOREIGN PATENT DOCUMENTS

| | | |
|---|---|---|
| CN | 102066919 A | 5/2011 |
| CN | 104883153 A | 9/2015 |
| DE | 102016123708 B3 | 4/2018 |
| WO | 2011101314 | 8/2011 |

\* cited by examiner

△ BAW device with first BAW resonator and shunt BAW resonator  
□ BAW device of FIG. 1 (without dummy conductor track)  
◇ BAW device of FIG. 1

BULK ACOUSTIC WAVE DEVICE WITH REDUCED NON-LINEARITIES

CROSS-REFERENCE TO RELATED APPLICATION

This application is a 371 National Stage of PCT Application No. PCT/EP2020/061372, filed on Apr. 23, 2020, which claims priority to Germany Application No. 10 2019 111 172.2, filed on Apr. 30, 2019, which are assigned to the assignee hereof. The disclosure of the prior Applications is considered part of and is incorporated by reference into this Patent Application.

A BAW (BAW=Bulk Acoustic Wave) device is specified.

One object to be achieved is to provide a BAW device with an efficient suppression of nonlinear effects.

This object is achieved, inter alia, by the subject-matter of independent claim 1. Advantageous embodiments and further developments are the subject of the dependent claims.

According to at least one embodiment, the BAW device comprises a first BAW resonator and a second BAW resonator. The first BAW resonator and the second BAW resonator are coupled to each other. For example, the first and the second BAW resonators are connected or cascaded in anti-series or in series or in anti-parallel or in parallel. Preferably, there is no further BAW resonator connected in (anti-)series or in (anti-)parallel between the first and the second BAW resonator.

The cascade of the first and the second BAW resonator is preferably connected to a shunt resonator. The shunt resonator may be a BAW resonator. The shunt resonator may be connected to ground.

According to at least one embodiment, the first BAW resonator and the second BAW resonator each comprise a first electrode, a second electrode and a piezoelectric layer. The piezoelectric layer is arranged in each case between the first electrode and the second electrode of the associated BAW resonator. For example, the first electrodes are arranged in each case on a top side of the associated piezoelectric layer, the second electrodes may be arranged in each case on a bottom side of the associated piezoelectric layer opposite to the top side. Alternatively, the first electrodes are arranged in each case on the bottom side, whereas the second electrodes are arrange on the top side. In particular, the BAW device comprises a substrate, like a Si-Substrate, on which the piezoelectric layer is applied and by which the piezoelectric layer is carried. The bottom side of the piezoelectric layer is the side facing the substrate.

The electrodes are preferably metallic. For example, the electrodes comprise or consist of one or more of the following metals: Al, Cu, Ti, Cr, Au or Mo. The piezoelectric layer may be a thin-film. The piezoelectric material of the piezoelectric layers may be AlN or ZnO or AlScN.

The electrodes may be in direct contact with the associated piezoelectric layers. Main extension planes of the electrodes and the piezoelectric layers are preferably essentially parallel to each other. The mean thickness of the piezoelectric layers, measured in each case perpendicular to the main extension plane of the piezoelectric layer, may be in each case at most 5 µm or at most 1 µm or at most 100 nm. Additionally or alternatively, the mean thickness of the piezoelectric layers is in each case at least 5 nm or at least 50 nm or at least 75 nm. The electrodes may each have a mean thickness, measured parallel to the main extension plane of the electrode, between 50 nm and 300 nm inclusive.

The first electrodes of the first and second BAW resonator may each have an area of at least 10×10 µm² or at least 30×30 µm². Additionally or alternatively, the first electrodes may each have an area of at most 500×500 µm² or at most 300×300 µm². Each electrode is preferably designed in a simply-connected manner, i.e. contiguously and without interruptions.

The piezoelectric layers of the first and second BAW resonator may be connected to each other. For example, the piezoelectric layers of the two BAW resonators are integrally formed with each other, i.e. formed in one piece. Thus, both piezoelectric layers are formed by a common piezoelectric layer. The first electrodes are preferably arranged on a top side of the common piezoelectric layer.

Likewise, the second electrodes of the first and the second BAW resonators may be connected to each other, in particular may be integrally formed with each other. Especially, the second electrodes of the first and second BAW resonator may be formed by a common metallic layer.

According to at least one embodiment, the first electrodes, the second electrodes and the piezoelectric layers of both BAW resonators are designed essentially identically. In other words, the first electrodes of the first and the second BAW resonator are designed essentially identically, the second electrodes of the first and the second BAW resonator are designed essentially identically and the piezoelectric layers of the first and the second BAW resonator are designed essentially identically.

Here and in the following, identically designed elements are in particular elements which are made of the same material or material composition and which have the same geometrical shape.

Here and in the following, the term "designed essentially identically" means that two elements are designed identically within the manufacturing tolerance. This means that deviations only arise from unwanted deviations during manufacturing. Deviations, for example in the geometrical shape, are not included by purpose. If you map two elements to each other, the elements intersect in an intersection region. For example, two essentially identical elements can be mapped to each other in such a way that the volume of the intersection region deviates from the volume of each of the elements by less than 5% or less than 1%. "Mapping" means here and in the following that a transformation is applied which does not change the size and the shape of an element, e.g. rotation and/or translation.

According to at least one embodiment, the BAW device comprises a first conductor track, which extends from the first electrode of the second BAW resonator to a third electric element of the BAW device. The first conductor track electrically connects said first electrode of the second BAW resonator with said third electric element.

The first conductor track and the first electrode of the second BAW resonator may be of the same material, particularly may be integrally formed with each other. The third electric element may be an electric terminal, for example an input terminal or output terminal or ground terminal, or a capacitor or an inductance or a further BAW resonator. During the intended operation of the BAW device, current is flowing through the first conductor track from the first electrode to the third electric element or vice versa. This means that, at an end of the first conductor track remote from the first electrode of the second BAW resonator, electric current is supplied by the third electric element or electric current is dissipated to the third electric element during operation. Thus, the first conductor track is intended to transport electric current from the second BAW resonator to the third electric element or vice versa.

The term "third electric element" is used herein, as the first and the second BAW resonators may be called a first and a second electric element respectively.

According to at least one embodiment, the BAW device comprises a first dummy conductor track. The first dummy conductor track extends from the first electrode of the first BAW resonator, is electrically connected to said first electrode of the first BAW resonator and, apart from said first electrode of the first BAW resonator, is not electrically connected to any further electric element.

The first dummy conductor track and the first electrode of the first BAW resonator may be of the same material, in particular may be integrally formed with each other. The first dummy conductor track is a conductor track connected at one side only. At an end of the dummy conductor track remote from the first electrode of the first BAW resonator, current is neither supplied nor dissipated during the intended operation. This remote end is not electrically connected during the intended operation. In other words, the first dummy conductor is not intended to transport current during the intended operation of the BAW device.

According to at least one embodiment, the first dummy conductor track is designed such that, during operation, it influences the acoustic and capacitive properties of the first BAW resonator essentially in the same way as the first conductor track influences the acoustic and capacitive properties of the second BAW resonator. "Essentially" means that there might be differences in the influences, but these differences are negligible and/or not measurable and/or do not disturb the intended operation of the BAW device.

During intended operation of the BAW device, the first dummy conductor track and the first conductor track both bring about an additional mechanical load in the associated BAW resonators, which influences the creation and propagation of acoustic waves inside the piezoelectric layers. Particularly, the resonant frequencies of the BAW resonators are influenced in this way. The first dummy conductor track is preferably designed such that its influence on the resonant frequency and/or on the creation and propagation of acoustic waves inside the first BAW resonator is essentially the same as the influence of the first conductor track on the resonant frequency and/or on the creation and propagation of acoustic waves inside the second BAW resonator.

Moreover, the first dummy conductor track and the first conductor track both influence the capacity and thus also the shape of the electric fields which are produced between the first and the second electrodes of the associated BAW resonators during operation. The first dummy conductor track is preferably designed such that its influence on the capacity and on the shape of the electric fields in the first BAW resonator is essentially the same as the influence of the first conductor track in the second BAW resonator.

The design options for the first dummy conductor track are essentially the material and/or the geometrical shape and/or the position inside the first BAW resonator. Preferably, the first dummy conductor track and the first conductor track are formed as layers of the same material and of essentially the same mean thickness. The design options for the first dummy conductor track are then the geometrical shape and/or position.

In at least one embodiment, the BAW device comprises a first BAW resonator and a second BAW resonator. The first BAW resonator and the second BAW resonator each comprise a first electrode, a second electrode and a piezoelectric layer being arranged in each case between the first electrode and the second electrode of the associated BAW resonator. The first electrodes, the second electrodes and the piezoelectric layers of both BAW resonators are designed essentially identically. A first conductor track extends from the first electrode of the second BAW resonator to a third electric element of the BAW device and electrically connects said first electrode with said third electric element. A first dummy conductor track extends from the first electrode of the first BAW resonator, is electrically connected to said first electrode and, apart from said first electrode, is not electrically connected to any further electric element. The first dummy conductor track is designed such that it influences the acoustic and capacitive properties of the first BAW resonator essentially in the same way as the first conductor track influences the acoustic and capacitive properties of the second BAW resonator.

The present invention is based, inter alia, on the recognition that nonlinearities, such as harmonics and intermodulation distortion, can be suppressed by cascading critical resonators with a phase shifted excitation of the resonators within the cascade. The resonators may be connected in anti-series or in anti-parallel. The power density is decreased by having a larger active region of the individual resonators that are required to give the same total capacitance of the cascade as in an uncascaded resonator. The phase shift leads to a cancellation of certain parasitic nonlinear effects. This works best if both resonators are geometrically, acoustically and electromagnetically symmetric, i.e. if the electromagnetic and the mechanical displacement fields are identical (besides polarity) in both resonators. However, the different resonators may comprise different electrode connections (conductor tracks). This is disadvantageous as these electrode connections exhibit parasitic capacitances. Additionally, the acoustic behavior of the individual resonators in the cascade is different if one resonator has an electrode connection to another electric element that the other resonator doesn't have.

One idea of the present invention is to include an electrically ineffective electrode connection (dummy conductor track) to this other resonator of the cascade. In this way, the two resonators of the cascade are made almost perfectly symmetric and thus unwanted nonlinearities can be efficiently suppressed.

According to at least one embodiment, in a top view, the dummy conductor track overlaps with the second electrode of the first BAW resonator in a first overlap region. In the same top view, the first conductor track overlaps with the second electrode of the second BAW resonator in a second overlap region. The first overlap region and the second overlap region are essentially identical.

The acoustically active region of a BAW resonator is essentially defined by the overlap region between the associated first and second electrode, when viewed in the top view. A conductor track, electrically connected to the first electrode, increases the acoustically active region, particularly if it overlaps with the second electrode. This influences the acoustic and capacitive properties of the BAW resonator. This influence could be suppressed if an overlap between the conductor track and the second electrode would be avoided, for example if branches to further elements are only applied to electrode connections far outside the resonator and not to the resonator active region itself. However, in densely packed designs of BAW devices, this is most often not possible due to area limitations.

By designing the first dummy conductor track such that the first and the second overlap region are essentially identical, the influence of the first dummy conductor track on the acoustic and capacitive properties of the first BAW resonator can be adapted to the influence of the first conductor track on the acoustic and capacitive properties of the second BAW resonator. For this purpose, the materials and the mean thicknesses of the first dummy conductor track and first conductor track are preferably chosen to be the same.

Here and in the following, the top view is a view on a top side or bottom side of the BAW device, i.e. a view on a top side or bottom side of the piezoelectric layer(s), said top side or bottom side facing the first electrodes. Here and in the following, an overlap region, in which one element overlaps with another element, when viewed in the top view, can also be defined as the region in which the two elements intersect if both elements are projected onto the top side or bottom side of the piezoelectric layer(s).

The fact that two overlap regions are essentially identical means that the two overlap regions have essentially the same geometrical shape, when viewed in the top view. For example, one overlap region can be mapped to the other overlap region in such a way that an intersection between the two overlap regions has an area which deviates from the area of each of the two overlap regions by at most 5% or at most 1%.

According to at least one embodiment, in a top view, the first electrode of the first BAW resonator together with all further conductor tracks and dummy conductor tracks extending from the first electrode of the first BAW resonator overlap with the second electrode of the first BAW resonator in a third overlap region. In the same top view, the first electrode of the second BAW resonator together with all conductor tracks and dummy conductor tracks extending from the first electrode of the second BAW resonator overlap with the second electrode of the second BAW resonator in a fourth overlap region. The third overlap region and the fourth overlap region are essentially identical.

This means that besides the dummy conductor track there might be one or more conductor tracks and/or one or more further dummy conductor tracks extending for the first electrode of the first BAW resonator. Likewise, one or more further conductor tracks and/or one or more dummy conductor tracks might extend from the first electrode of the second BAW resonator. All conductor tracks and dummy conductor tracks may be formed integrally with the associated first electrode. The third overlap region is defined as the region in which the first electrode of the first BAW resonator together with all dummy conductor tracks and conductor tracks extending from this first electrode overlap with the second electrode of the first BAW resonator, when viewed in the top view. A corresponding definition applies to the fourth overlap region.

Preferably, in the top view, the first electrode of the first BAW resonator lies completely inside the third overlap region. The first dummy conductor track preferably lies partially inside the third overlap region and protrudes from the third overlap region. Possibly existing further dummy conductor tracks and/or conductor tracks extending from this first electrode preferably lie partially inside the third overlap region and protrude from the third overlap region. The same can apply to the second BAW resonator.

A conductor track may be defined in the same way as the first conductor track. Particularly, a conductor track is intended to transport current from one of its ends to another during the intended operation. Likewise, a dummy conductor track may be defined like the first dummy conductor track. A dummy conductor track is not intended to transport current from one of its ends to another.

The third and fourth overlap region of the first and second BAW resonators essentially correspond to the active regions of these BAW resonators. Thus, with essentially identical third and fourth overlap regions, the first and the second BAW resonator have essentially the same acoustic and capacitive properties. For example, the first and the second BAW resonator thus have essentially the same resonant frequency and the shapes of the electric fields arising during the intended operation between the associated electrodes are essentially identical.

According to at least one embodiment, the first dummy conductor track extends starting from the first electrode of the first BAW resonator and in a direction away from the first electrode of the first BAW resonator over a length of at least 0.5 µm or at least 1 µm or at least 1.5 µm or at least 2 µm or at least 3 µm. Additionally or alternatively, the first dummy conductor track extends over a length of at most 10 µm.

A width of the dummy conductor track might be at least 1 µm or at least 5 µm or at least 10 µm. Additionally or alternatively, the width might be at most 300 µm or at most 100 µm or at most 50 µm. The thickness of the first dummy conductor track may be between 50 nm and 300 nm inclusive. Particularly, the mean thickness of the first dummy conductor track can be the same as the mean thickness of the first electrode from which it extends.

The length of the dummy conductor track is preferably measured perpendicular to an edge of the electrode from which the first dummy conductor track starts extending. The width is preferably measured parallel to the edge of the electrode from which the first dummy conductor track starts extending. The thickness of the first dummy conductor track is measured perpendicular to a main extension plane of the first electrode.

The dimensions specified for the first dummy conductor track may apply to the first conductor track and/or to all further dummy conductor tracks and/or all further conductor tracks of the BAW device.

According to at least one embodiment, a second conductor track extends from the first electrode of the first BAW resonator to a fourth electric element of the BAW device and electrically connects the first electrode of the first BAW resonator with said fourth electric element. The fourth electric element is different from the second BAW resonator and also from the third electric element. For example the fourth electric element is an electric terminal, like an input or output or ground terminal, or a capacitor or an inductance or a further BAW resonator. The further BAW resonator may be a shunt resonator and or a further BAW resonator of the cascade connected in (anti-)series or in (anti-)parallel to the first BAW resonator.

According to at least one embodiment, a third conductor track extends from the first electrode of the second BAW resonator to a fifth electric element of the BAW device and electrically connects the first electrode of the second BAW resonator with the fifth electric element. The fifth electric element is preferably different from the first BAW resonator and from the third electric element and from the fourth electric element. The fifth electric element can be an electric terminal, like an input or output or ground terminal, or a capacitor or an inductance or a further BAW resonator. The further BAW resonator may be a shunt resonator and or a further BAW resonator of the cascade connected in (anti-) series or in (anti-)parallel to the second BAW resonator.

According to at least one embodiment, the third electric element is a third BAW resonator comprising a first electrode, a second electrode and a piezoelectric layer being arranged between the first electrode and the second electrode of said third BAW resonator. The piezoelectric layer of the third BAW resonator may be connected with the piezoelectric layers of the first and/or second BAW resonator. Preferably, the piezoelectric layer of the third BAW resonator is integrally formed with the piezoelectric layers of the first and/or the second BAW resonator.

According to at least one embodiment, the first conductor track electrically connects the first electrode of the second BAW resonator with the first electrode of the third BAW resonator.

According to at least one embodiment, the third BAW resonator is a shunt resonator. The second electrode of the third BAW resonator may be electrically connected to a ground terminal during the intended operation.

According to at least one embodiment, the third electric element is an electric terminal or an inductance or a capacitor.

According to at least one embodiment, the first BAW resonator and the second BAW resonator are cascaded or connected in anti-series. In this case, the second electrodes of the first and the second BAW resonator are electrically connected, whereas the first electrodes are electrically isolated from each other.

According to at least one embodiment, the first BAW resonator and the second BAW resonator are cascaded or connected in anti-parallel. In this case, the first electrode of the second BAW resonator is electrically connected to the second electrode of the first BAW resonator and the first electrode of the first BAW resonator is electrically connected to the second electrode of the second BAW resonator.

According to at least one embodiment, the first and the second BAW resonators are both solidly mounted BAW (SMR) resonators or are both membrane type thin film resonators (FBAR).

According to at least one embodiment, the electrodes of the first and the second BAW resonators each have a substantially rectangular shape, when viewed in the top view. Alternatively, the electrodes of the first and the second BAW resonator have for example an oval shape or a pentagonal shape or a hexagonal shape, when viewed in the top view. In particular, the shapes of the electrodes are asymmetric so that the electrodes do not show a circular symmetry or an n-fold rotational symmetry. Asymmetric shapes of the electrodes are advantageous with respect to the acoustic properties of the BAW resonators.

According to at least one embodiment, a transverse edge of the first electrode of the first BAW resonator faces a transverse edge of the first electrode of the second BAW resonator, when viewed in the top view. The transverse edges of both electrodes may essentially run parallel to each other.

According to at least one embodiment, the first dummy conductor track and the first conductor track each extend from longitudinal edges of the associated first electrodes. The longitudinal edges run perpendicularly or transversely to the transverse edges, when viewed in the top view. Preferably, the first dummy conductor track and the first conductor track extend in opposite directions away from the associated first electrodes. For example, the width of the first dummy conductor track is smaller than the length of the longitudinal edge from which the first dummy conductor track extends. For example the width of the first dummy conductor track is at most half or at most 75% or at most 50% of the length of the longitudinal edge. The same dimensions may apply to the first conductor track and the associated longitudinal edge, from which the first conductor track extends.

According to at least one embodiment, the first and the second BAW resonators each have a resonant frequency of at least 1 GHz. Preferably, the resonant frequencies of the BAW resonators are each at most 6 GHz or at most 8 GHz.

According to at least one embodiment, the piezoelectric layers of the first and the second BAW resonator are integrally formed with each other. Integrally formed means that the layers are made from one piece. Thus, the layers are connected and within the manufacturing tolerance there are no interfaces between the layers.

The BAW device of the present invention may be a BAW filter or a duplexer or a multiplexer. The BAW device may be used in communication devices, for example in smartphones.

Hereinafter, a BAW device described herein will be explained in more detail with reference to drawings on the basis of exemplary embodiments. Same reference signs indicate same elements in the individual figures. However, the size ratios involved are not to scale, individual elements may rather be illustrated with an exaggerated size for a better understanding.

Figure 1B:
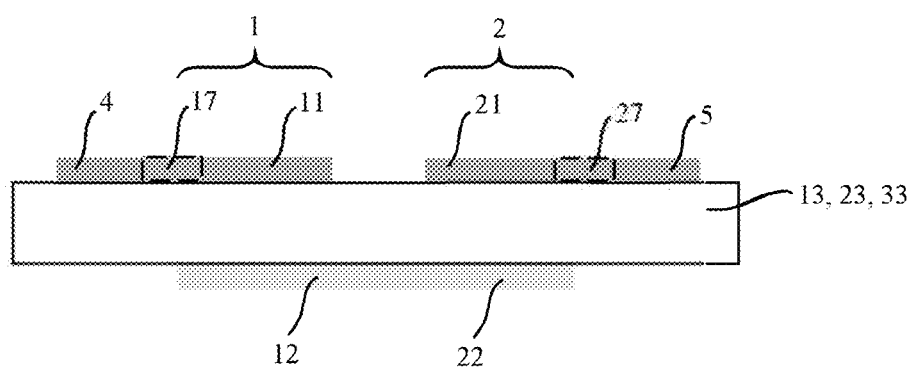
Figure 1C:
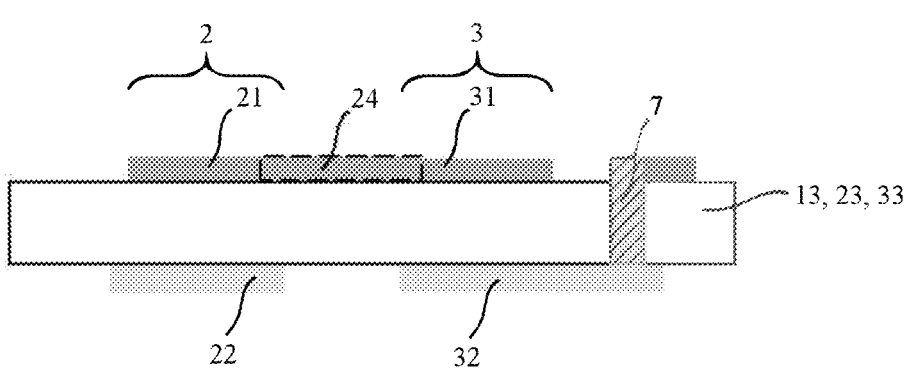
Figure 1D:
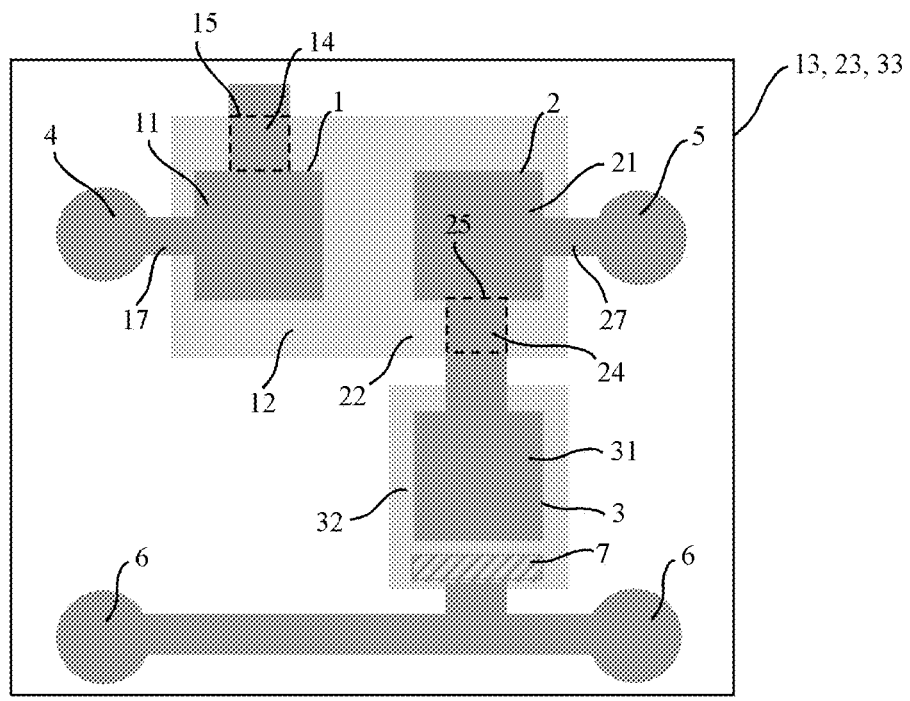
Figure 1E:
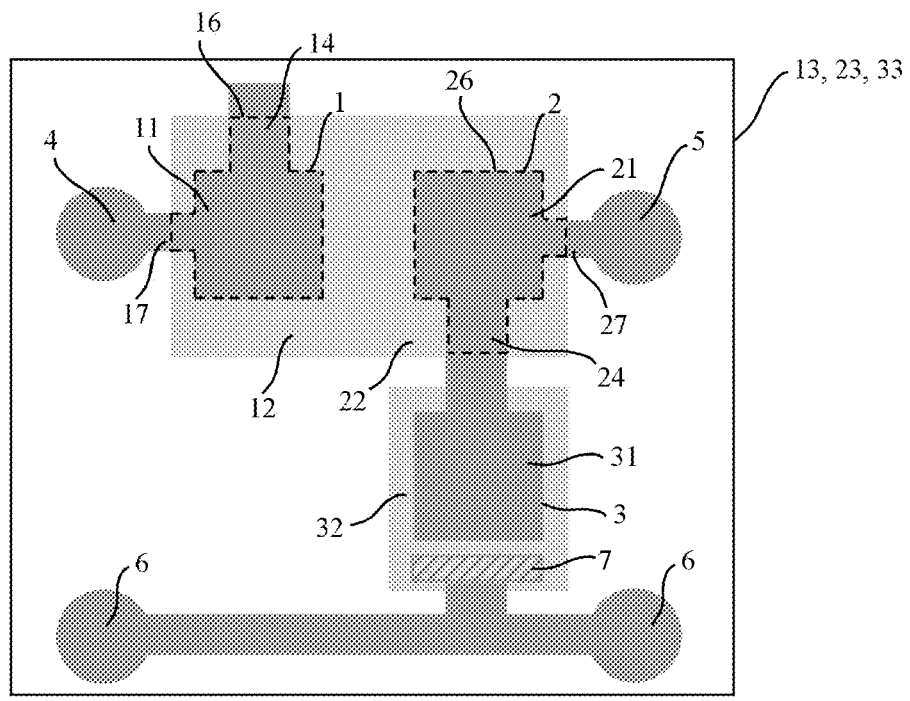
Figure 2:
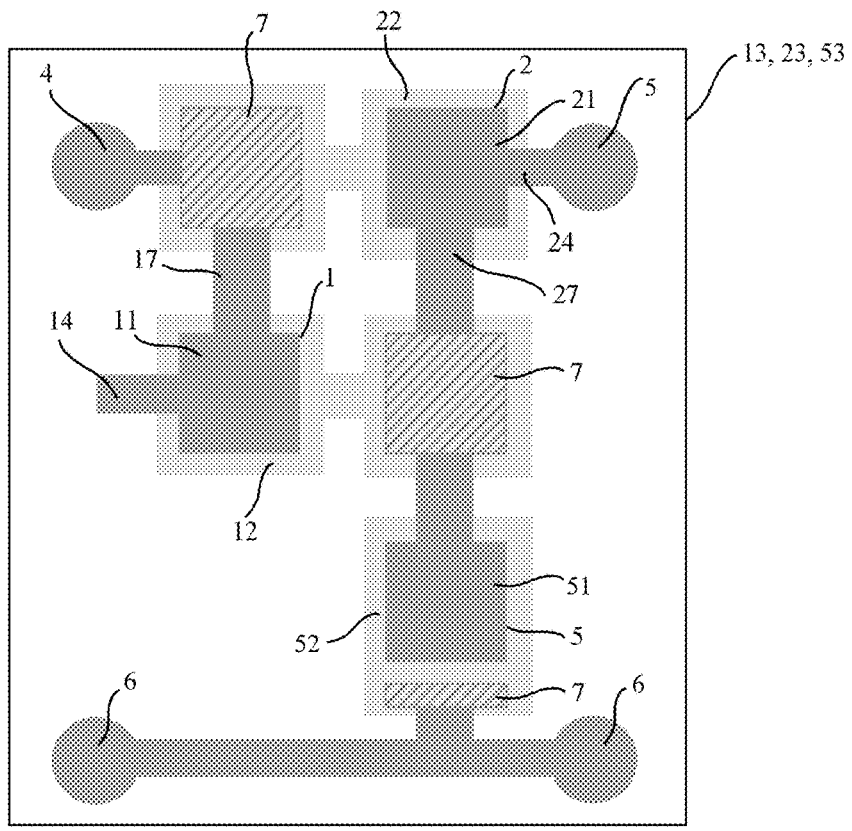
Figure 3:
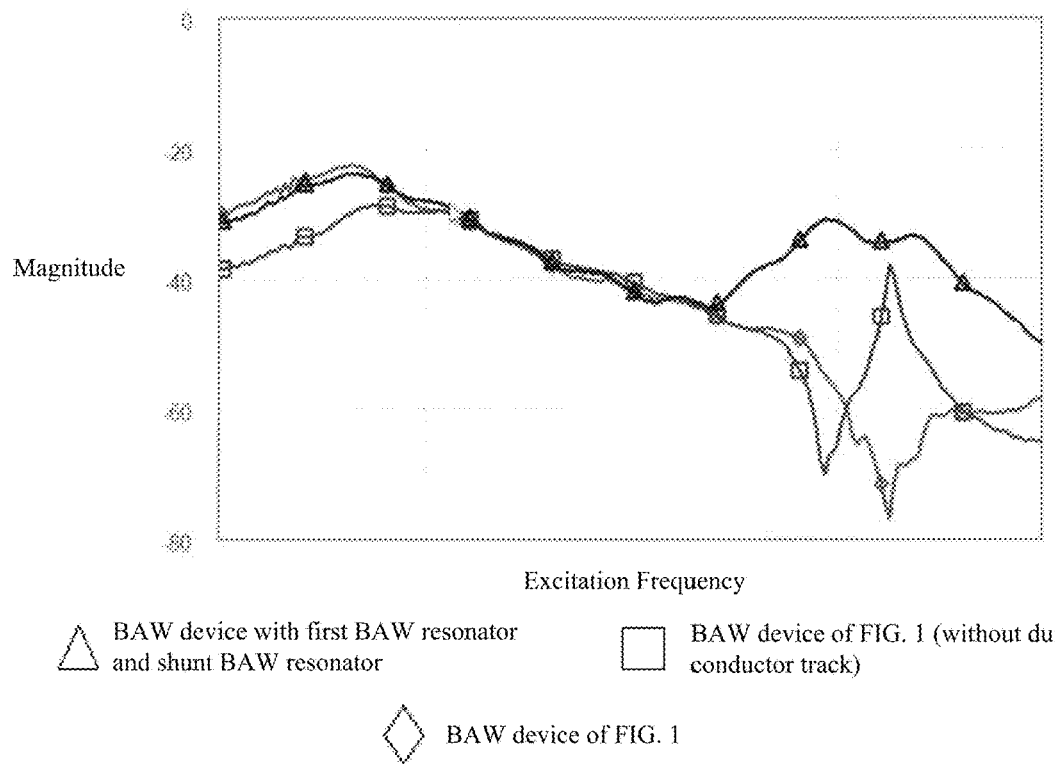

It is shown in:

FIGS. 1A to 1E a first exemplary embodiment of the BAW device in different views, FIG. 2 a second exemplary embodiment of the BAW device in a top view, and FIG. 3 comparative measurements of three different BAW devices.

FIG. 1A shows a top view onto a first exemplary embodiment of the BAW device. FIG. 1B is a cross-sectional view of the BAW device with a cut along the line AA' of FIG. 1A. FIG. 1C is a cross-sectional view with a cut along the line BB' of FIG. 1A.

The BAW device comprises a first BAW resonator 1 and a second BAW resonator 2. Each of the BAW resonators 1, 2 comprises a first electrode 11, 21 and a second electrode 12, 22. The first electrodes 11, 21 form top electrodes and the second electrodes 12, 22 form bottom electrodes. For each BAW resonator 1, 2, a piezoelectric layer 13, 23 is arranged between the associated first electrode 11, 21 and the associated second electrode 12, 22 (see FIG. 1B).

The electrodes 11, 12, 21, 22 of the first and second BAW resonators 1, 2 are for example made of a metal, like Al. The first electrodes 11, 21 are electrically isolated from each other. In the top view of FIG. 1A, each of the first electrodes 11, 21 has a rectangular shape with an area of, for example, between 30×30 µm$^2$ and 300×300 µm$^2$ inclusive. The second electrodes 12, 22 of both BAW resonators 1, 2 are connected and are integrally formed with each other. The two BAW resonators 1, 2 are connected in anti-series.

The piezoelectric layers 13, 23 of both BAW resonators 1, 2 are also connected and formed integrally with each other. For example, the piezoelectric layers 13, 23 are formed by a common thin-film made from AlN or AlN doped with Sc.

As can be seen in FIG. 1A, the first electrode 21 of the second BAW resonator 2 is electrically connected to a third electric element 3 in the form of a third BAW resonator. The third BAW resonator is a shunt resonator. A first electrode 31 of the third electric element 3 is electrically connected to the first electrode 21 of the second BAW resonator 2 via a first conductor track 24. A second electrode 32 of the third electric element 3 is electrically isolated from the second electrodes 12, 22 of the first and second BAW resonator 1, 2. A piezoelectric layer 33 of the third electric element 3, which is located between the first electrode 31 and the second electrode 32, is formed integrally with the piezoelectric layers 13, 23 of the first and second BAW resonators 1, 2.

The second electrode 32 of the third electric element 3 is electrically connected to ground terminals 6. The ground terminals 6 are located on a top side of the piezoelectric layer 13, 23, 33, on which also the first electrodes 11, 21, 31 are located. The electric connection of the second electrode 32 to the ground terminal 6 is realized by a through connection 7 through the piezoelectric layer 13, 23, 33. The BAW device of FIG. 1 is a BAW filter.

The first electrode 11 of the first BAW resonator 1 is electrically connected to a fourth electric element 4 in the form of an electric terminal 4. The electric terminal 4 is for example an input terminal. The electric connection between the input terminal 4 and the first electrode 11 is realized by a second conductor track 17. The first electrode 21 of the second BAW resonator 2 is electrically connected to a fifth electric element 5 in the form of an electric terminal which, for example, is an output terminal. The electric connection to the fifth electric element 5 is realized by a third conductor track 27.

In FIG. 1A the first electrodes 11, 21, 31 and the associated conductor tracks 17, 24, 27 extending from the first electrodes are in each case formed integrally with each other. However, this is just an example. It is also possible for the conductor tracks 17, 24, 27 to be formed from different materials than the first electrodes 11, 21, 31.

As becomes obvious when considering FIG. 1A, the first electrode 21 of the second BAW resonator 2 is electrically connected to two further electric elements 3, 5. The first electrode 11 of the first BAW resonator 1, however, is only electrically connected to one electric element 4. The conductor tracks 17, 24, 27 used for the electric connections have an influence on the acoustic and capacitive properties of the associated BAW resonators. Thus, due to the different number of conductor tracks, there would usually be an asymmetry between the two BAW resonators 1, 2 connected in anti-series, which in turn usually reduces the efficiency of desired cancellation effects with phase-shifted excitations within a cascade and thus also reduces efficiency of suppression of non-linear effects.

In the BAW device of the present invention, however, a dummy conductor track 14 is used, which extends from the first electrode 11 of the first BAW resonator 1. This dummy conductor track 14 is electrically ineffective and is not intended to transport current during the operation of the BAW device. The end of the dummy conductor track 14 remote from the first electrode 11 is not electrically connected during the intended operation. At this remote end, no current is supplied or dissipated during the intended operation. However, this dummy conductor track 14 establishes a symmetry between both BAW resonators 1, 2. In particular, the dummy conductor track 14 is designed in such a way that it influences the acoustic and capacitive properties of the first BAW resonator 1 in the same way as the first conductor track 24 influences the acoustic and capacitive properties of the second BAW resonator 2.

This can be better understood when considering FIGS. 1D and 1E. In the top view of FIG. 1D, it can be seen that the first dummy conductor track 14 overlaps with the second electrode 12 in a first overlap region 15, indicated by a dashed rectangle. The first conductor track 24 overlaps with the second electrode 22 of the second BAW resonator 2 in a second overlap region 25, which is also indicated by a dashed rectangle. The first overlap region 15 and the second overlap region 25 are essentially identical, i.e. they have the same geometrical shape and the same size. Also the mass of the first dummy conductor track 14 integrated over the first overlap region 15 is preferably the same as the mass of the first conductor track 24 integrated over the second overlap region 25. Moreover, the first dummy conductor track 14 protrudes beyond the second electrode 12 as far as it takes until the acoustic fields are decayed. In this way, the additional mechanical load of the first conductor track 24, influencing the acoustic properties of the second BAW resonator 2, and the additional capacity introduced by the first conductor track 24 is imitated in the first BAW resonator 1 by the first dummy conductor track 14.

Additionally, as can best be seen in FIG. 1E, the first dummy conductor track 14 is located at such a position that the acoustic and capacitive properties of the first BAW resonator 1 and of the second BAW resonator 2 are essentially identical. Considering the first BAW resonator 1 in the top view of FIG. 1E, the first dummy conductor track 14, the first electrode 11 and the second conductor track 17 overlap with the second electrode 12 in a third overlap region 16, the contour of which is indicated by the dashed line. Considering now the second BAW resonator 2 in the top view of FIG. 1E, the first conductor track 24, the first electrode 21 and the third conductor track 27 overlap with the second electrode 22 in a fourth overlap region 26. The third and fourth overlap regions 16, 26 essentially correspond to the active regions of the associated BAW resonators.

As can be seen, the third and the fourth overlap regions 16, 26 are essentially identical. This means that the third overlap region 16 can be mapped congruently on the fourth overlap region 26 by a simple mathematical translation and rotation. This symmetry between the third and the fourth overlap region 16, 26 established by the dummy conductor track 14 guarantees that both BAW resonators 1, 2 have essentially the same acoustic and capacitive properties. This significantly improves the filter properties of the BAW device.

FIG. 2 shows a second exemplary embodiment of the BAW device in a top view. The BAW device comprises two BAW resonators 1, 2 which are connected in anti-parallel. The two BAW resonators 1, 2 each comprise a first electrode 11, 21, a second electrode 12, 22 and a piezoelectric layer 13, 23 located between the associated first and second electrode. The first electrode 21 of the second BAW resonator 2 is electrically connected to a first electrode 51 of a third electric element 3, such as in the form of a third BAW resonator. The third BAW resonator is a shunt resonator. The third BAW resonator comprises, besides the first electrode 51, a second electrode 52 and a piezoelectric layer 53.

The electric connection between the first electrode 21 of the second BAW resonator 2 and the third BAW resonator 5 is established by a third conductor track 27. A similar second conductor track 17 connects the first electrode 11 of the first BAW resonator 1 with an input terminal 4. Thus, the acoustic and capacitive influence of the third conductor track 27 of the second BAW resonator 2 is essentially identically to the influence of the second conductor track 17 of the first BAW resonator 1.

However, the first electrode 21 of the second BAW resonator 2 is additionally electrically connected to an output terminal 3 via a first conductor track 24. Such an additional electric connection is not foreseen for the first electrode 11 of the first BAW resonator 1. In order to imitate the influence of the first conductor track 24 on the acoustic and capacitive properties of the second BAW resonator 2, a first dummy conductor track 14 extends from the first electrode 11 of the first BAW resonator 1. The shape, the size and the position of the first dummy conductor track 14 is again chosen in order to guarantee that both BAW resonators 1, 2 essentially have the same acoustic and capacitive properties.

FIG. 3 shows measurements of the second harmonics of different BAW devices. On the y-axis the magnitude is shown, on the x-axis the excitation frequency is shown.

The measurement indicated by the triangles corresponds to a BAW device with a first BAW resonator and a shunt BAW resonator, but without a second BAW resonator connected in series or anti-series. At the right side of the graph the contribution of the second harmonic is clearly visible as a broad peak.

The measurement indicated by the squares corresponds to a BAW device as for example shown in FIG. 1, but without the dummy conductor track 14. The anti-series connection of two BAW resonators already efficiently reduces the contribution of the second harmonic but still a sharp peak of the second harmonic is visible.

The measurement indicated by the diamonds corresponds to a BAW device according to the present invention, particularly according to the exemplary embodiment of FIG. 1. It can be clearly seen that due to the dummy conductor track, which establishes an almost perfect symmetry between the anti-serially connected BAW resonators in terms of acoustic and capacitive properties, the contribution of the second harmonic can be suppressed even more efficiently.

The invention described herein is not limited by the description in conjunction with the exemplary embodiments. Rather, the invention comprises any new feature as well as any combination of features, particularly including any combination of features in the patent claims, even if said feature or said combination per se is not explicitly stated in the patent claims or exemplary embodiments.

REFERENCE SIGN LIST 1 first BAW resonator
2 second BAW resonator
3 third electric element
4 fourth electric element
5 fifth electric element
6 ground terminal
11 first electrode of first BAW resonator
12 second electrode of first BAW resonator
13 piezoelectric layer of first BAW resonator
14 first dummy conductor track
15 first overlap region
16 third overlap region
17 second conductor track
21 first electrode of second BAW resonator
22 second electrode of second BAW resonator
23 piezoelectric layer of second BAW resonator
24 first conductor track
25 second overlap region
26 fourth overlap region
27 third conductor track
31 first electrode of third BAW resonator
32 second electrode of third BAW resonator
33 piezoelectric layer of third BAW resonator
51 first electrode of third BAW resonator
52 second electrode of third BAW resonator
53 piezoelectric layer of third BAW resonator

The invention claimed is:
1. A BAW device, comprising:
a first BAW resonator; and
a second BAW resonator, wherein:
the first BAW resonator and the second BAW resonator each comprise a first electrode, a second electrode, and a piezoelectric layer, the piezoelectric layer of the associated BAW resonator being arranged in each case between the first electrode and the second electrode of the associated BAW resonator,
a first conductor track extends from the first electrode of the second BAW resonator to a third electric element of the BAW device and electrically connects said first electrode of the second BAW resonator with said third electric element,
a first dummy conductor track extends from the first electrode of the first BAW resonator and is electrically connected to said first electrode of the first BAW resonator,
in a top view, the first dummy conductor track overlaps with the second electrode of the first BAW resonator in a first overlap region, and
in the top view, the first conductor track overlaps with the second electrode of the second BAW resonator in a second overlap region.

2. The BAW device according to claim 1, wherein:
in the top view, the first electrode of the first BAW resonator together with a second conductor track extending from the first electrode of the first BAW resonator and the first dummy conductor track overlap with the second electrode of the first BAW resonator in a third overlap region,
in the top view, the first electrode of the second BAW resonator together with the first conductor track and a third conductor track extending from the first electrode of the second BAW resonator overlap with the second electrode of the second BAW resonator in a fourth overlap region.

3. The BAW device according to claim 1, wherein the first dummy conductor track extends starting from and in a direction away from the first electrode of the first BAW resonator over a length of at least 0.5 μm.

4. The BAW device according to claim 2, wherein;
the second conductor track extends from the first electrode of the first BAW resonator to a fourth electric element of the BAW device and electrically connects said first electrode of the first BAW resonator with said fourth electric element, and
the third conductor track extends from the first electrode of the second BAW resonator to a fifth electric element of the BAW device and electrically connects said first electrode of the second BAW resonator with said fifth electric element.

5. The BAW device according to claim 1, wherein;
the third electric element is a third BAW resonator comprising a first electrode, a second electrode and a piezoelectric layer being arranged between the first electrode and the second electrode of said third BAW resonator, and
the first conductor track electrically connects the first electrode of the second BAW resonator with the first electrode of the third BAW resonator.

6. The BAW device according to claim 5, wherein the third BAW resonator is a shunt resonator.

7. The BAW device according to claim 1, wherein the third electric element is an electric terminal or an inductance or a capacitor.

8. The BAW device according to claim 1, wherein the first BAW resonator and the second BAW resonator are cascaded in anti-series.

9. The BAW device according to claim 1, wherein the first BAW resonator and the second BAW resonator are cascaded in anti-parallel.

10. BAW device according to claim 1, wherein the first and the second BAW resonators are both solidly mounted BAW resonators or are both film BAW resonators.

11. The BAW device according to claim 1, wherein the first electrodes and the second electrodes of the first and the second BAW resonator each have a rectangular shape.

12. The BAW device according to claim 11, wherein:
- a transverse edge of the first electrode of the first BAW resonator faces a transverse edge of the first electrode of the second BAW resonator, and
- the first dummy conductor track and the first conductor track each extend from longitudinal edges of the associated first electrodes, said longitudinal edges running perpendicularly to said transverse edges.

13. The BAW device according to claim 1, wherein the first and the second BAW resonator each have a resonant frequency of at least 1 GHz.

14. The BAW device according to claim 1, wherein the piezoelectric layers of the first and second BAW resonator are integrally formed with each other.

\* \* \* \* \*